United States Patent [19]

Luscher

[11] 4,392,453

[45] Jul. 12, 1983

[54] MOLECULAR BEAM CONVERTERS FOR VACUUM COATING SYSTEMS

[75] Inventor: Paul E. Luscher, Sunnyvale, Calif.

[73] Assignee: Varian Associates, Inc., Palo Alto, Calif.

[21] Appl. No.: 296,288

[22] Filed: Aug. 26, 1981

[51] Int. Cl.³ .......................................... C23C 13/08
[52] U.S. Cl. .................................. 118/726; 118/715; 118/724; 156/614; 156/DIG. 103; 156/611; 148/175
[58] Field of Search ...................... 427/255.2; 118/725, 118/726, 715, 722, 724; 156/DIG. 103, 611, 613, 610, 614; 148/175

[56] References Cited

U.S. PATENT DOCUMENTS 4,159,919  7/1979  McFee et al. ................ 156/610 X
4,181,544  1/1980  Cho ..................... 156/DIG. 103 X

OTHER PUBLICATIONS

P. E. Luscher et al., "Design Consideration for Molecular Beam Epitaxy Systems", *Prog. Crystal Growth Charact.*, vol. 2, pp. 15-33, Pergamon Press 1979.
W. S. Knodle et al., "Recent Developments in Device Fabrication by MBE", Semiconductor International, Nov. 1980, pp. 39-52.
A. Y. Cho et al., "Molecular Beam Epitaxy" *Progress in Solid State Chemistry*, vol. 10, Part 3, pp. 157-191, Pergamon Press (1975), L. L.
Chang et al., in *Epitaxial Growth*, Part A, ed J. W. Mathews pp. 37-72, Academic Press (1975).
P. E. Luscher, "Crystal Growth by Molecular Beam Epitaxy," *Solid State Technology*, Dec. 1977, pp. 43-52.
A. R. Calawa, "On the Use of AsH₃ in the Molecular Beam Epitaxial Growth of GaAs", *Appl. Phys. Lett.* 38(9), May 1, 1981, pp. 701-703.
T. G. O'Neill, "Production Oriented MBE Systems", *Semiconductor Int'l*, Nov. 1980, pp. 57-66.
M. B. Panish, "Molecular Beam Epitaxy of GaAs and InP with Gas Sources for As and P", *J. Electrochem. Soc.: Solid State Science and Technology*, V. 127, Dec. 1980, pp. 2729-2733.

Primary Examiner—John D. Smith
Assistant Examiner—Bernard F. Plantz
Attorney, Agent, or Firm—Stanley Z. Cole; Robert L. Jepsen; Leon F. Herbert

[57] ABSTRACT

This invention relates to coating of substrates in a vacuum system. A beam of molecules incident upon a molecular beam converter is transformed into a molecular beam flowing from the converter toward a substrate to be coated, or on which a layer is to be grown epitaxially. The incident beam is directed onto a heated impingement surface. In most embodiments the impingement surface generally faces the substrate to be coated, and the incident beam strikes the surface from the substrate side. A heating means maintains the impingement surface at a designated temperature. The heating means is separated and shielded from the impingement surface to avoid introducing contaminants from the heating means into the converted molecular beam, and also to avoid adverse physical and chemical effects on the heating means caused by the incident beam and its dissociation products. The incident beam may consist of gaseous compounds of normally solid materials which are at least partially dissociated at the heated impingement surface; the converted beam will then differ from the incident beam in direction, angular distribution, and molecular species. Alternatively, the incident beam may consist of atoms or molecules of elemental solids, in which case reflection and angular redistribution, with or without further dissociation, may occur at the heated impingement surface. Coating uniformity and step coverage can be improved by controlling the size and shape of the incident beam.

32 Claims, 12 Drawing Figures

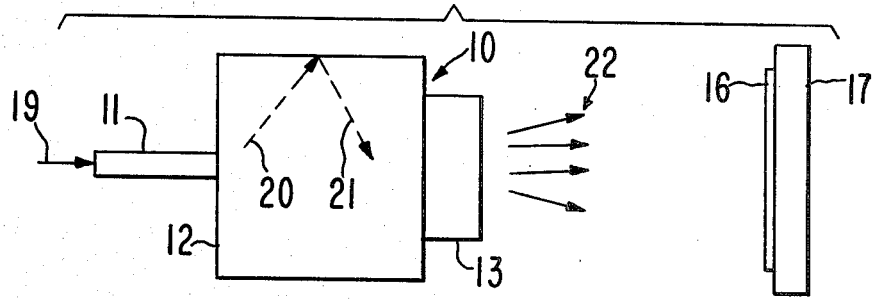
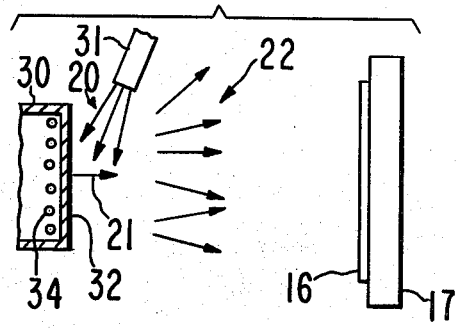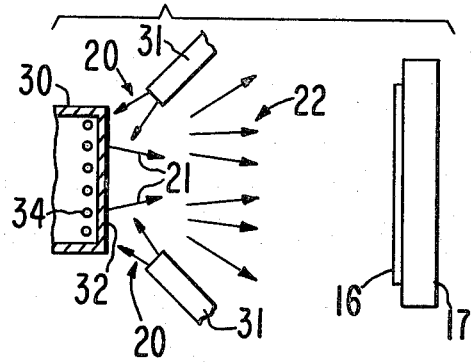
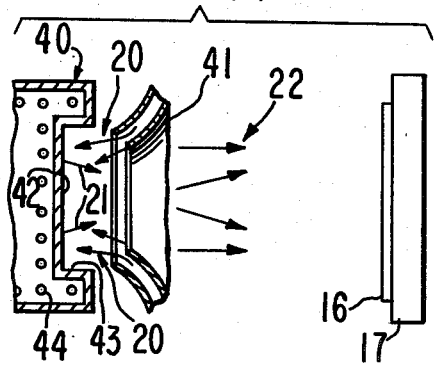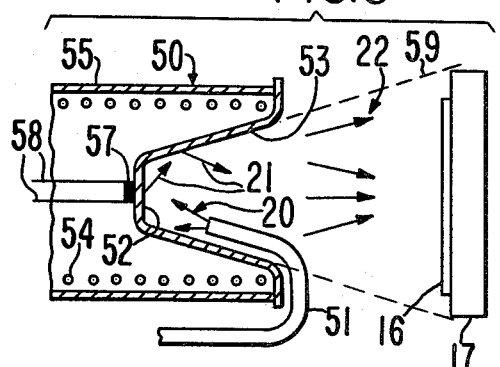
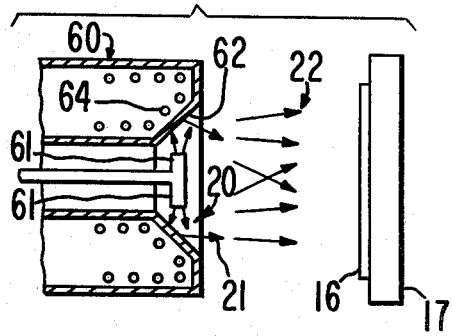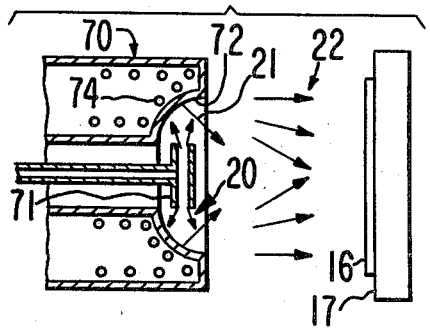

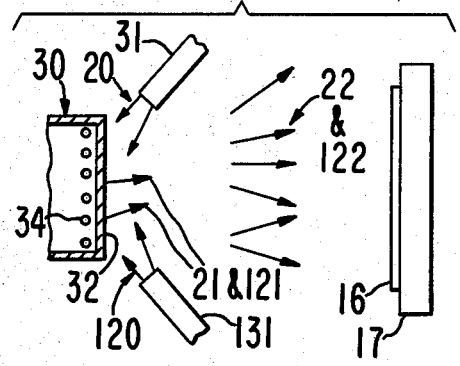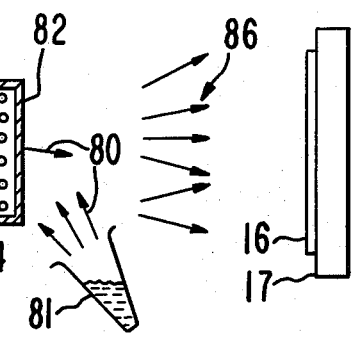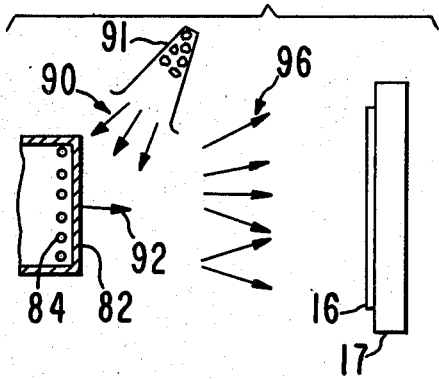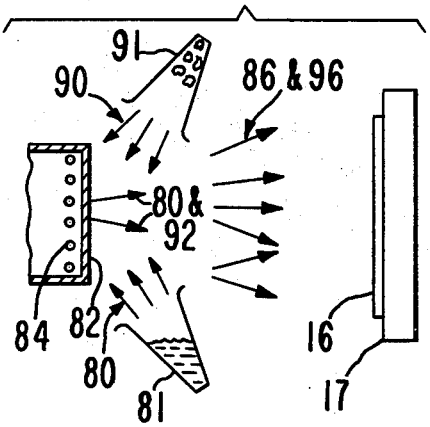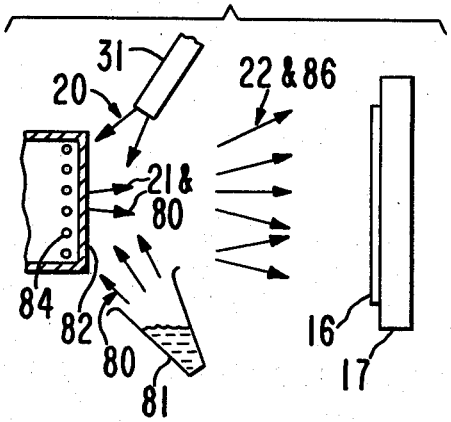

MOLECULAR BEAM CONVERTERS FOR VACUUM COATING SYSTEMS

DESCRIPTION

1. Field of the Invention

This invention relates to the production of molecular beams for coating workpieces in a vacuum coating apparatus. More particularly, the invention relates to the production of such molecular beams to grow high purity films by means of molecular beam epitaxy.

2. Background of the Invention

Vacuum coating of workpieces is in widespread and growing use in industry. The two main methods of transferring coating material from a solid source to the workpieces are thermal evaporation and cathodic sputtering.

In certain applications, it is important that the coatings be grown epitaxially on a substrate. Both liquid phase epitaxy (LPE) and vapor phase epitaxy (VPE) are in common use. The relatively new technique of molecular beam epitaxy (MBE) is growing in importance. Until recently, the commercially available MBE systems were research oriented. Now several equipment manufacturers have developed or are developing production oriented MBE systems. In most of the applications to date, molecular beams of selected elements are formed by evaporation from melts of normally solid materials (solid, that is, at normal room temperatures) or they are formed by sublimation in an ultrahigh vacuum environment (base pressures prior to evaporation and/or sublimation are normally in the low $10^{-10}$ to $10^{-11}$ Torr range, or the low $10^{-8}$ to $10^{-9}$ Pa range). The molecular species in the beams may be monatomic, polyatomic, or both. These molecular beams are directed at a substrate which will foster epitaxial growth. The substrate is usually a planar single crystal wafer of a compound semiconductor or an elemental semiconductor. Multiple sources may be used sequentially or simultaneously. The rate of epitaxial growth may be quite precisely controlled, thereby allowing formation of very thin layers (as thin as a single monolayer) and abrupt junctions. For a discussion of the state of the molecular beam epitaxy art see, for example, A. Y. Cho, et al, "Molecular Beam Epitaxy", *Progress in Solid State Chemistry*, Vol. 10, Part 3, pp. 157–191 (1975); L. L. Chang, et al, pp. 37–72 in *Epitaxial Growth*, Part A, ed. J. W. Mathews, Academic Press (1975); P. E. Luscher, "Crystal Growth by Molecular Beam Epitaxy", *Solid State Technology*, December 1977, pp. 43–52 (1977); P. E. Luscher and D. M. Collins, "Design Considerations for Molecular Beam Epitaxy Systems", *Progress in Crystal Growth Characterization*, Vol. 2, pp. 15–32, Pergamon Press (1979); W. S. Knodle and P. E. Luscher, "Recent Developments in Device Fabrication by MBE", *Semiconductor International*, November 1980, pp. 39–52; and T. G. O'Neill, "Production Oriented MBE Systems", *Semiconductor International*, November 1980, pp. 57–66.

In both VPE (vapor phase epitaxy) and CVD (chemical vapor deposition), gaseous compounds of normally solid materials are caused to impinge on a substrate. The substrate is heated to a temperature which is sufficient to dissociate the gaseous compound, whereby the normally solid material component accumulates on the surface of the substrate provided the substrate temperature is not high enough to cause a net evaporation or sublimation of the normally solid material. Epitaxial growth (thus VPE) of the normally solid material on the substrate can occur if the substrate characteristics are compatible with such growth. In some applications, the high substrate temperatures required for dissociation adversely affect certain important characteristics of the substrate and epitaxial layer combinations. These adverse effects may be greatly reduced in MBE because the substrate temperatures at which epitaxial growth occurs are significantly below those required for dissociation.

Certain of the materials commonly used in MBE are depleted more rapidly than others. Rapid depletion can give rise to problems in molecular beam uniformity and intensity, and also necessitates frequent replenishment of source material. The use of gas dissociation sources for molecular beams of arsenic and phosphorous was reported recently in a paper by Panish (M. B. Panish, "Molecular Beam Epitaxy of GaAs and InP with Gas Sources for As and P", *J. Electrochem. Soc.: Solid-State Science and Technology*, V. 127, December 1980, pp. 2729–2733). Arsine ($AsH_3$) and phosphine ($PH_3$) were used as source gases. The source gases were conveniently introduced into a "leak source" in the MBE system by means of an external gas handling system. The leak source was operated at sufficiently high temperatures to thermally decompose arsine and phosphine to produce molecular beams of arsenic and phosphorous. The leak source shown in FIG. 2 of Panish 1980 supra employs a long alumina tube extending into an alumina and molybdenum furnace, and the relative flux distribution for arsenic is shown in FIG. 3 of the Panish paper. It is noted from this FIG. 3 that the flux distribution is much less uniform (much more sharply peaked in the forward direction) than the reference cosine distribution.

Other recent work with a gas dissociation source using arsine has been reported by Calawa (A. R. Calawa, "On the Use of $AsH_3$ in the Molecular Beam Epitaxial Growth of GaAs" *Appl. Phys. Lett.* 38(9), 1 May 1981, pp. 701–703). Calawa finds that three molecular species are produced in his gas dissociation source (or "cracking furnace"). These are the monomer (As or $As_1$), the dimer ($As_2$), and the tetramer ($As_4$) species. It is believed that the monomer specie is the most preferred, while the tetramer specie is the least desired in terms of the quality of the resulting epitaxially-grown GaAs films and the efficiency of utilization of arsenic. It is anticipated that that a similar situation may exist with other materials of interest in MBE, particularly the Group V elements. It is believed that the higher polymers are produced as a result of multiple collisions between lower polymers on or near a surface of the cracking furnace. Such multiple collisions are fostered by the large length-to-diameter ratio of the furnace (about forty).

It is also reported in Calawa 1981 supra that "the highest purity layers were grown with the cracking furnace at the minimum temperature of 620° C." Operation of the furnace at higher temperatures caused doping of the epitaxially-grown layers. Calawa states that "the impurity responsible for this doping at high furnace temperatures is likely to be silicon from the quartz wall of the furnace." (In Calawa's furnace, the source gas is introduced into the annular space between the heated quartz liner and the outer tantalum tube.)

Although much of the MBE research work has been directed toward III-V compounds such as GaAs and InP, a growing interest is developing in silicon MBE. Vacuum evaporation of silicon is very difficult due to silicon's low vapor pressure. Thus far, silicon sources for MBE have employed direct electron beam bombardment of the silicon as the heating means. Electron beam heating yields a relatively unstable source with a tendency toward "spitting". Furthermore, with electron beam heating evaporation from the silicon melt is vertical or near vertical, contributing to a return of flaking deposits into the evaporation source, which further aggravates the spitting problem and which may introduce contaminants into the epitaxially-grown films.

In the prior art, arsine and phosphine have been dissociated in gas dissociation sources to produce molecular beams of arsenic and phosphorous for MBE. Also in the prior art, silane ($SiH_4$) has been used to deposit silicon on a heated substrate (CVD and VPE). None of the prior art, however, has described the use of silane in a gas dissociation source to produce molecular beams of silicon for MBE as an alternative to evaporation by electron beam heating.

Accordingly, it is an object of the invention to provide an improved source of molecular beams of silicon.

A further object of the invention is to provide a gas dissociation source to produce molecular beams of silicon.

A more specific object of the invention is to provide a gas dissociation source for use with silane as the source gas to produce molecular beams of silicon for the growth of epitaxial layers of silicon.

Another object of the invention is to provide an improved gas dissociation source for use with gaseous compounds of normally solid materials as source gases to produce molecular beams of much improved uniformity of the normally solid materials.

Yet another object of the invention is to provide an improved gas dissociation source for use with arsine, phosphine, and silane as source gases to produce molecular beams of much improved uniformity of arsenic, phosphorous, and silicon.

Another object of the invention is to provide an improved gas dissociation source in which formation of higher polymers of the molecular species is avoided or much reduced.

An additional object of the invention is to provide an improved gas dissociation source in which the introduction of impurities by the gas dissociation source is avoided or much reduced.

Yet another object of the invention is to provide an improved gas dissociation source in which the means for heating the impingement surface is shielded from the incident molecular beam and its dissociation products, whereby: corrosion reactions between the incident gas and the heating means are avoided; resistivity changes of heater filaments due to deposition of dissociation products on the filaments are avoided; coating of heater support insulators by dissociation products is avoided; and introduction of impurities from the heater into the molecular beams of dissociation products is avoided.

Other objects of the invention will become apparent from the ensuing "Summary of the Invention" and "Detailed Description".

SUMMARY OF THE INVENTION

This invention relates to the production of molecular beams by transforming or converting a stream or beam of molecules incident upon a "molecular beam converter" into a "converted molecular beam" flowing from the converter toward a substrate to be coated or a substrate on which a layer is to be grown epitaxially.

In the preferred embodiments of the invention, an "incident molecular beam" (herein defined as a stream or beam of incident molecules) is formed and directed by a molecular source onto a "heated impingement surface" of the molecular beam converter. In most of these embodiments, the heated impingement surface generally faces the substrate to be coated, and the incident molecular beam strikes the heated impingement surface from the front (substrate) side. The impingement surface is heated from the back side (away from the substrate) by a heating means which enables the impingement surface to be maintained at a designated temperature. The heating means is separated and shielded from the impingement surface and from the space between the impingement surface and the substrate to avoid introducing contaminants from the heating means into the converted molecular beam, and also to avoid adverse physical and chemical effects on the heating means caused by the incident molecular beam and its dissociation products.

In certain preferred embodiments the incident molecular beams consists of gaseous compounds of normally solid materials. In the cases of the gases arsine, phosphine, and silane the corresponding normally solid materials are the elements arsenic, phosphorous, and silicon. If the temperature of the impingement surface is sufficiently high, the converted molecular beams will differ from the incident molecular beams in direction of molecular flow, in angular distribution of molecular flow, and in the content of molecular species. In the case of silane, for example, the molecular specie in the incident molecular beam is $SiH_4$, and the converted molecular beam may contain the dissociation products Si and $H_2$, plus undissociated $SiH_4$.

In cases where formation of higher polymers of the molecular species is to be avoided or minimized, it is desirable to avoid multiple collisions of dissociated gas molecules with each other. This imposes limits on gas pressures (and hence on mean free paths) near the impingement surface, which in turn affects the maximum incident gas flow rate that can be employed for a given converter geometry. At sufficiently low incident gas flow rates, the use of a planar impingement surface allows collisions of dissociated species with the planar surface to be avoided, and for a small area of incident gas impingement on the planar impingement surface the molecular flux will have a cosine distribution.

In cases where polymer formation is not of primary concern, non-planar surfaces may be employed to achieve certain benefits. Examples include stubby cylinders and cones. In both of these examples, the flux in the molecular beam is more sharply peaked in the forward direction than in the planar case. This increases the utilization of source material, but does so at the expense of uniformity of the flux of molecules in the converted molecular beam, and hence in the uniformity of arrival rate of molecules over the area of the substrate.

As noted above, the incident molecular beam is formed and directed by a molecular source onto the heated impingement surface of the molecular beam converter. In cases where the incident molecular beam consists of a gaseous compound of a normally solid material, the gaseous compound may, for example, be supplied to the molecular source from a source gas storage container external to the vacuum system; the gaseous compound may be supplied at a controlled rate to the molecular source through an accurately controllable leak valve, for example; and the incident molecular beam may be directed by the molecular source onto selected areas of the heated impingement surface by a source gas feed means. In one embodiment the source gas feed means is a small diameter tubular nozzle directing the incident molecular beam toward the central area of the heated impingement surface.

Uniformity can be improved by providing multiple or annular feeds for the source gas. A plurality of source gas feeds distributed over a planar surface, for example, will produce a corresponding plurality of cosine flux distributions. Judicious choices of the spatial distribution patterns of the source gas feeds coupled with individual controls of flow rates should allow a high degree of control over flux uniformity in the converted molecular beams. In addition, molecules will arrive at the substrate from a variety of directions due to the distributed nature of the source, thereby contributing to improved "step coverage", which is vitally important in some semiconductor applications. Alternatively, a plurality of source gas feeds or an annular source gas feed may be used to direct source gas onto the inner surface of a section of a figure of revolution, such as a cone or a sphere, thereby increasing the utilization of source material without unduly sacrificing uniformity.

In addition to the epitaxial growth of such semiconductors as Si, GaAs, and InP, molecular beams produced using gas dissociation in molecular beam converters may provide dopants during epitaxial growth. Since dopant levels are normally in the range $10^{15}$ to $10^{18}$ cm$^{-3}$, fluxes in the dopant molecular beam are several orders of magnitude less than in the main molecular beams. Source gas flow control provides a convenient means for controlling the dopant beam flux. In some cases it may be desirable to feed the dopant source gas(es) onto the same heated impingement surface as used for the main source gas, either using separate feeds or premixing the source gases upstream of the feed.

In certain applications it may be useful to employ a heated impingement surface in additional or alternative roles. An incident molecular beam of monatomic gallium from a gallium furnace, for example, may be directed onto a heated planar impingement surface, causing this beam to be angularly redistributed and reflected toward the substrate, still as atomic gallium. In addition, molecular species such as $As_4$ in an incident molecular beam from an arsenic furnace may be dissociated at the heated impingement surface into $As_1$ and $As_2$. Finally, the heated impingement surface may be employed to simultaneously dissociate incident molecular beams of source gases and angularly redistribute, dissociate, and reflect incident molecular beams from other sources.

In certain embodiments of the invention a molecular beam converter is used with silane as the source gas for the incident molecular beam to produce a converted molecular beam containing the element silicon. In most of these embodiments the incident molecular beam impinges on the front side of a heated impingement surface which generally faces the substrate, and the heating means is isolated from the impingement surface to avoid introducing contaminants from the heating means into the converted molecular beam, and also to avoid adverse physical and chemical effects on the heating means caused by the incident molecular beam and its dissociation products. In one particular embodiment, however, the constraint that the heated impingement surface should generally face the substrate is removed in the interest of increasing gas dissociation efficiency by configuring the impingement surface to promote multiple collisions of the silane molecules with the heated impingement surface. To avoid introducing contaminants from the heating means, and also to avoid potential damage to the heating means, it is necessary, as in the other embodiments, that the heating means be isolated from the heated impingement surface.

A further embodiment of the invention is the use of a molecular beam converter for sequentially coating a plurality of substrates individually.

BRIEF DESCRIPTION OF THE DRAWINGS

For a more complete understanding of the present invention, reference should made to the accompanying drawings which are incorporated herein by reference and in which:

FIG. 1 shows schematically a source gas entering a generalized molecular beam converter from the left and a converted molecular beam of dissociation products flowing to the right toward a substrate to be coated;

FIG. 2 shows in partial section a molecular beam converter having a planar heated impingement surface facing a substrate, a single feed directing source gas onto the planar impingement surface, and a converted molecular beam of dissociation products flowing toward the substrate;

FIG. 3 shows a molecular beam converter as in FIG. 2 with a plurality of feeds (two shown);

FIG. 4 shows in partial section a molecular beam converter having a heated stubby cylinder generally facing a substrate and an annular feed directing source gas onto the bottom of the cylinder;

FIG. 5 shows in partial section a molecular beam converter having a heated flat-bottomed cone generally facing a substrate and a single feed directing source gas into the bottom region of the cone;

FIG. 6 shows in partial section a molecular beam converter having a heated truncated conic impingement surface generally facing a substrate and a plurality of feeds (two shown) directing source gas onto the conic surface;

FIG. 7 shows in partial section a molecular beam converter having a heated truncated spheric impingement surface generally facing a substrate and an annular feed directing source gas onto the spheric surface;

FIG. 8 shows in partial section a molecular beam converter having a planar heated impingement surface facing a substrate, a plurality of feeds (two shown) directing a plurality of different source gases onto the planar impingement surface, and a converted molecular beam of dissociation products flowing toward the substrate.

FIG. 9 shows in partial section a planar heated impingement surface facing a substrate, an incident molecular beam from an evaporation source incident upon the planar impingement surface, and the converted molecular beam being reflected from the planar impingement surface toward the substrate;

FIG. 10 shows in partial section a planar heated impingement surface facing a substrate, an incident molecular beam from a sublimation source incident upon the planar impingement surface, and the converted molecular beam being thermally dissociated at and reflected from the planar impingement surface toward the substrate;

FIG. 11 shows FIGS. 9 and 10 in combination; and

FIG. 12 shows FIGS. 2 and 9 in combination.

DETAILED DESCRIPTION

FIG. 1 shows a generalized molecular beam converter 10 comprising a gas feed means 11, a heated impingement surface 12, and an optional effuser 13. Facing effuser 13 on the right is a substrate 16 to be coated, mounted on a substrate holder 17 which may be provided with means for controlling substrate temperature (not shown).

In most cases a source gas 19 is a gaseous compound of a normally solid material (solid at normal room temperatures). Important examples are arsine, phosphine, and silane, which are hydrides of the normally solid materials, arsenic, phosphorus, and silicon. Alternatively, source gas 19 may be a mixture of two or more gases or gaseous compounds. Source gas 19 enters gas feed means 11 at relatively high pressure from the left via a gas handling system (not shown). Gas feed means 11 forms an incident molecular beam 20 consisting of source gas molecules 19, and directs incident molecular beam 20 onto heated impingement surface 12. Heated impingement surface 12 is operated at a designated temperature which is sufficiently high to thermally dissociate ("crack") source gas molecules 19 into dissociated species 21, and also to evaporate or sublimate dissociated species 21. Dissociated species 21 flow from heated impingement surface 12 through optional effuser 13 to form a converted molecular beam 22 flowing toward substrate 16. In the cases of arsine, phosphine, and silane the dissociated species are hydrogen gas plus the normally solid materials arsenic, phosphorus, and silicon respectively. (According to Calawa 1981 supra, the presence of hydrogen as a background gas "has been shown to be beneficial in the growth of high-quality GaAs layers".) In addition, heated impingement surface 12 is made of materials which are compatible with the required operating temperatures, which do not react chemically to any appreciable extent with the source gases or their dissociated species, and which do not introduce significant quantities of contaminants into converted molecular beam 22. Moreover, the heating means (not shown) by which impingement surface 12 is heated is separated and shielded from impingement surface 12 to avoid introducing contaminants from the heating means into converted molecular beam 22, and also avoid damage to the heating means through interactions with source gas molecules 19 and dissociated species 21.

The purpose of optional effuser 13 is to shape the flux distribution in converted molecular beam 22 flowing from molecular beam converter 10. Requirements on effuser geometry will be determined by the specifics of the application. Considerations regarding operating temperature and materials selection are essentially the same for effuser 13 as for heated impingement surface 12.

In general, converted molecular beam 22 will contain both normally gaseous and normally solid species (hydrogen gas and silicon in the case where source gas 19 is silane, for example). Substrate 16 is normally operated at a temperature such that excessive recombination at the substrate between the gaseous and normally solid species in converted molecular beam 22 is avoided, yet the substrate temperature is not so high that significant re-evaporation of the normally solid specie takes place. Thus upon arrival at substrate 16 the gaseous specie will be reflected and the substrate will be coated with the normally solid material. The coating will grow epitaxially (thus MBE) provided the conditions prevailing at substrate 16 foster such growth.

In generalized molecular beam converter 10 the possibility exists for multiple collisions among dissociated species 21 and between the dissociated species and heated impingement surface 12 and effuser 13. Such collisions foster polymer formation. Thus in the case of arsenic, for example, the dimer specie $As_2$ and the tetramer specie $As_4$ are known to form in addition to the monomer specie $As_1$ (see Calawa 1981 supra). In some applications it is important to minimize such polymer formation. This may be accomplished by operating at sufficiently low source gas flow rates that collisions among the dissociated species are acceptably small, in combination with configuring the molecular beam converter to reduce or eliminate collisions between the dissociated species and heated impingement surface 12.

Shown in FIG. 2 is a molecular beam converter 30 with a planar impingement surface 32 generally parallel to and facing substrate 16. Impingement surface 32 is heated from the back side as shown schematically by means of a heater 34. A source gas feed 31 directs incident molecular beam 20 onto impingement surface 32, where dissociated species 21 are produced. Dissociated species 21 flow from inpingement surface 32 generally toward substrate 16 as converted molecular beam 22. At sufficiently low source gas flow rates, planar impingement surface 32 allows collisions of dissociated species with impingement surface 32 to be avoided. (If source gas flow rates are too high, molecule-molecule collisions will cause some of the molecules in converted molecular beam 22 to be scattered back toward surface 32.) And for sufficiently small areas of impingement of incident molecular beam 20 on surface 32, the flux in resulting molecular beam 22 will have a cosine distribution. (A cosine distribution at the substrate will obtain when the impingement area is small in comparison with the surface area of an imaginary sphere containing both the impingement area and the substrate in its surface.)

In some applications it may be necessary or desirable to modify the pattern of flux distribution in converted molecular beam 22. A ring source, for example, may be achieved by using a continuous, annular, ring-shaped feed, as shown in FIGS. 4 and 7, or may be approximated by using a plurality of source gas feeds 31 arranged in a spaced-apart relationship around the periphery of a circular disk. The use of two such source gas feeds 31 is shown schematically in FIG. 3.

One potential benefit of a distributed feed is improved spatial uniformity in the arrival rate at the substrate of molecules in the converted molecular beam. Another benefit is improved "step coverage" because molecules will arrive at the substrate from a variety of directions. Yet another benefit is that for a fixed source gas flow rate the pressures of source gas and dissociation prroducts near the impingement surface are lower than they would be for a single small-area feed, whereby fewer molecule-molecule collisions will occur. Alternatively, the use of a distributed feed may allow higher flow rates to be employed.

Other means of flux distribution modification may be employed, either additionally or alternatively, as shown in FIGS. 4 through 7. A molecular beam converter 40 in FIG. 4 is shown as a stubby cylinder with an annular source gas feed 41 directing incident molecular beam 20 onto a flat bottom 42. Flat bottom 42 and a wall 43 of the stubby cylinder are heated from the back side as shown schematically by a heater 44. Flat bottom 42 and wall 43 comprise the heated impingement surface in FIG. 4. Wall 43 of the stubby cylinder provides an additional surface at which dissociation can occur, thereby increasing dissociation efficiency, and also causing the molecular beams to be more sharply peaked in the forward direction than in the planar surface cases of FIGS. 2 and 3 (see, for example, Luscher and Collins 1979 supra, especially FIG. 6), thereby increasing the utilization of source material. The use of annular source gas feed 41 makes it possible to obtain a more uniform arrival rate of molecular species over the surface of substrate 16, and also to obtain improved "step coverage". Some of the dissociated species may undergo one or more collisions with impingement surface 42 and 43 before arriving at substrate 16, thereby increasing the probability of higher polymer formation as compared with the case of planar impingement surfaces 32 of FIGS. 2 and 3. This may or may not be acceptable, depending upon the specifics of the application.

A molecular beam converter 50 in FIG. 5 is shown as a flat-bottomed cone with a single gas feed 51 directing incident molecular beam 20 onto a flat bottom 52. Flat bottom 52 and conical sidewalls 53 are heated as shown schematically by a heater 54 surrounded by a heat shield 55. Flat bottom 52 and conical sidewalls 53 comprise the heated impingement surface in FIG. 5. The temperature of flat bottom 52 may be monitored by means of a thermocouple 57 with electrical leads 58, and this measurement of temperature may be used to control the power to heater 54, if desired, whereby the temperature of flat bottom 52 may be maintained at a designated value. In order to achieve reasonably uniform molecular flux arriving at substrate 16, it is important that the cone angle of conical sidewalls 53 be great enough that substrate 16 is at least encompassed by extensions 59 (shown as dashed lines) of conical sidewalls 53. In addition, it is important that source gas feed 51 be of sufficiently thin profile that shadowing due to feed 51 does not significantly degrade the uniformity of the flux of converted molecular beam 22 arriving at substrate 16.

Two additional examples of ring sources are shown in FIGS. 6 and 7. Molecular beam converters 60 and 70 have heated impingement surfaces 62 and 72 which are truncated conic and spheric sections respectively. A plurality (two shown) of centrally-located source gas feeds 61 directs incident molecular beam 20 onto heated impingement surface 52, and a centrally-located annular gas feed 71 directs incident molecular beam 20 onto heated impingement surface 72.

FIG. 8 shows molecular beam converter 30 of FIG. 2 with a source gas feed 131 added. Molecular beam 20 is directed onto heated impingement surface 32 by source gas feed 31, and a different source gas in an incident molecular beam 120 is directed onto surface 32 by a source gas feed 131. Dissociated species 21 and 121 are formed at surface 32, and flow therefrom toward substrate 16 in converted molecular beams 22 and 122. Each of the source gases in incident molecular beams 20 and 120 may provide a different element for the epitaxial growth of a compound semiconductor, for example. Alternatively, the source gas in incident molecular beam 20 may provide a major constituent in the epitaxially-grown semiconductor, and the source gas in incident molecular beam 120 may provide a dopant for the semiconductor. Since dopant levels are normally in the range $10^{15}$ to $10^{18}$ cm$^{-3}$, flux densities in dopant molecular beam 122 are several orders of magnitude less than in main molecular beam 22. Source gas flow control provides a convenient means for controlling dopant flux density. In some cases, it may be feasible and desirable to pre-mix the source gases, thereby eliminating the need for separate feeds. This could be particularly important in cases where multiple or annular feeds are used for control of molecular beam flux distribution.

In certain applications it may be useful to employ heated impingement surfaces in additional or alternative roles. As shown in FIG. 9, an incident molecular beam 80 from an evaporation source 81 is directed onto a heated planar impingement surface 82. Source 81 might, for example, be a gallium furnace, in which case incident molecular beam 80 would consist primarily of monatomic gallium. Impingement surface 82 is heated as shown schematically by a heater 84 to a designated temperature sufficiently great to re-evaporate the molecules in incident molecular beam 80 to form a converted molecular beam 86 directed generally toward substrate 16. Re-evaporation from impingement surface 82 causes converted molecular beam 86 to differ from incident molecular beam 80 in both direction and angular distribution; in a sense, re-evaporation causes "reflection" of the molecular beam. Angular distribution in converted molecular beam 86 is determined in part by the impingement pattern of incident molecular beam 80 on the reflecting surface, and in part by the geometry of the reflecting surface. For a small impingement area on planar impingement surface 82, the molecular flux in reflected molecular beam 86 will have an essentially cosine distribution, even if incident molecular beam 80 is sharply peaked in the forward direction, for example.

As shown in FIG. 10, an incident molecular beam 90 from a sublimation source 91 is directed onto heated planar impingement surface 82. Source 91 might be, for example, an arsenic furnace, in which case the molecular species in incident molecular beam 90 would be predominantly As$_4$. Some combination of dissociation at impingement surface 82 into dissociated species 92 and re-evaporation from impingement surface 82 converts incident molecular beam 90 into reflected and angularly redistributed molecular beam 96. In the case of arsenic some dissociation of the tetramer specie As$_4$ into the dimer specie As$_2$ and monomer specie As$_1$ will occur, especially if the designated temperature of heated impingement surface 82 is great enough, in which case incident molecular beam 90 of As$_4$ molecules is converted, at least in part, into molecular beam 96 of As$_2$ and As$_1$ molecules.

In MBE growth of compound semiconductors such as GaAs and (AlGa)As, for example, it may be desirable to thermally reflect, angularly redistribute, and further dissociate the various molecular species involved, including dopant molecules as well as the main molecular species. Although individual heated reflecting or impingement surfaces may be employed, it may be both simpler and more effective (better uniformity at substrate 16, for example) to direct the various incident molecular beams onto a common heated reflecting surface. FIG. 11 shows incident molecular beam 80 of FIG. 9 and incident molecular beam 90 of FIG. 10 incident simultaneously on heated impingement surface 82. Mixed converted molecular beams 86 and 96 are reflected toward substrate 16. Although not shown in FIG. 11, molecular species from auxiliary sources could be added, if desired.

FIG. 12 shows incident molecular beam 80 of FIG. 9 and incident molecular beam 20 of FIG. 2 incident simultaneously upon heated impingement surface 82. Surface 82 acts to reflect and angularly redistribute incident molecular beam 80 into converted molecular beam 86, and to dissociate incident molecular beam 20 into dissociated species 21 to form converted molecular beam 22. Mixed converted molecular beams 22 and 86 flow from impingement surface 82 toward substrate 16. Although not shown in FIG. 12, molecular species from auxiliary sources and other source gases could be added.

It should be noted in FIGS. 2-12 that heating is done from the "back" side of the heated surface while the incident molecular beams impinge on the front surface, which faces the substrate to be coated. Because of this arrangement, contamination of the converted molecular beams due to impurities contributed by hot filaments and by heated insulating materials, for example, can largely be avoided, as can degradation of filaments and insulators caused by source gas molecules and dissociation products. This represents an important improvement over the prior art arrangements of Panish (in which the source gas enters through a long alumina tube extending into an aluminum and molybdenum furnace [see FIG. 2 of Panish 1980 supra]) and of Calawa (in which the source gas is introduced into the annular space between the quartz liner and the outer tantalum tube of the cracking furnace [see FIG. 1 of Calawa 1981 supra]).

In the embodiments shown in FIGS. 1-12, the converted molecular beams are directed generally toward a single, centrally-positioned substrate. If desired, means can be provided for containing a plurality of substrates within the vacuum system, and means can further be provided for sequentially positioning individual substrates for coating or for growth of epitaxial layers.

Although various embodiments of the present invention have been described in some detail, it is understood that various changes and modifications may occur to persons of ordinary skill in the art without departing from the spirit and scope of the invention as defined in the appended claims.

What is claimed is:

1. A molecular beam converter for use in a vacuum system for coating a substrate, said molecular beam converter comprising:
   a body having an impingement surface generally facing said substrate;
   a heating means to enable said impingement surface to be maintained at a designated temperature;
   a molecular source for forming and directing an incident molecular beam onto said impingement surface;
   impingement of said incident molecular beam on said impingement surface maintained at said designated temperature causing a converted molecular beam to flow from said surface;
   said impingement surface and said molecular source in combination being configured to largely avoid impingement on said surface by molecular species in said converted molecular beam;
   said impingement surface and said molecular source in combination being configured and positioned to direct said converted molecular beam generally toward said substrate.

2. A molecular beam converter as in claim 1 in which said coating of said substrate is a layer grown epitaxially on said substrate.

3. A molecular beam converter as in claim 1 in which said heating means is separated and shielded from said impingement surface, whereby introduction of contaminants from said heating means into said converted molecular beam is avoided, and also whereby damage to said heating means through interaction with said incident and converted molecular beams is avoided.

4. A molecular beam converter as in claim 1 in which said incident molecular beam consists of a gaseous compound of a normally solid material, and in which said impingement on said impingement surface causes said gaseous compound to be at least partially dissociated, whereby said converted molecular beam contains molecular species of said normally solid material.

5. A molecular beam converter as in claim 4 in which said gaseous compound of a normally solid material is arsine and in which said converted molecular beam contains molecular species of arsenic.

6. A molecular beam converter as in claim 4 in which said gaseous compound of a normally solid material is phosphine and in which said converted molecular beam contains molecular species of phosphorus.

7. A molecular beam converter as in claim 4 in which said gaseous compound of a normally solid material is silane and in which said converted molecular beam contains molecular species of silicon.

8. A molecular beam converter as in claim 1 in which said incident molecular beam consists of polymeric molecular species of a normally solid material, and in which said impingement on said impingement surface causes at least partial dissociation of said polymeric molecular species into molecular species of lower polymeric order.

9. A molecular beam converter as in claim 1 in which said incident molecular beam consists principally of the tetramer molecular specie of arsenic, and in which said impingement on said impingement surface causes at least partial dissociation of said tetramer molecular specie of arsenic into dimer and monomer molecular species of arsenic.

10. A molecular beam converter as in claim 1 in which said incident molecular beam consists principally of the tetramer molecular specie of phosphorous and in which said impingement on said impingement surface causes at least partial dissociation of said tetramer molecular specie of phosphorous into dimer and monomer molecular species of phosphorus.

11. A molecular beam converter as in claim 1 in which said converted molecular beam consists of substantially the same molecular species as said incident molecular beam, said converted molecular beam differing generally from said incident molecular beam in direction of flow and in angular distribution.

12. A molecular beam converter as in claim 1 in which said molecular source is a gallium furnace directing a molecular beam of atomic gallium onto said heated impingement surface, said converted molecular beam consisting of said atomic gallium, said converted molecular beam differing generally from said incident molecular beam in direction of flow and in angular distribution.

13. A molecular beam converter as in claim 1 in which said substrate is generally planar and circular in shape.

14. A molecular beam converter as in claim 13 in which said impingement surface is a planar disc, said planar disc being generally parallel with said planar substrate, and in which central axes of said planar disc and said substrate generally coincide.

15. A molecular beam converter as in claim 14 in which the diameter of said planar disc is approximately the same as the diameter of said substrate, and in which said planar disc and said substrate are spaced axially apart by a distance greater than the diameter of said substrate.

16. A molecular beam converter as in claim 15 in which said incident molecular beam consists of a gaseous compound of a normally solid material, and in which said impingement on said impingement surface causes said gaseous compound to be at least partially dissociated, whereby said converted molecular beam contains molecular species of said normally solid material.

17. A molecular beam converter as in claim 16 in which said gaseous compound is supplied to said molecular source from a container external to said vacuum system, said gaseous compound being supplied at a controlled rate to said molecular source by a leak valve means, and said molecular source directing said incident molecular beam onto said impingement surface by a source gas feed means.

18. A molecular beam converter as in claim 17 in which said source gas feed means is a tubular nozzle having a diameter small in comparison with said diameter of said planar disc, said nozzle positioned to direct said incident molecular beam generally toward the central area of said planar disc, said nozzle positioned generally away from the path of flow of said converted molecular beam to said substrate.

19. A molecular beam converter as in claim 17 in which said source gas feed means comprises a plurality of tubular nozzles, said incident molecular beam thereby comprising a corresponding plurality of individual incident molecular beams, and said converted molecular beam thereby comprising a corresponding plurality of individual converted molecular beams, individual ones of said tubulr nozzles having diameters small in comparison with said diameter of said planar disc, said plurality of individual nozzles positioned to direct said plurality of individual incident molecular beams onto generally spaced-apart areas adjacent the periphery of said planar disc, whereby said converted molecular beam provides substantially improved step coverage and uniformity in arrival rate at said substrate of molecules from said converted molecular beam, said improved step coverage and uniformity being over the area of said substrate.

20. A molecular beam converter as in claim 17 in which said source gas feed means is of annular configuration and positioned to direct said incident molecular beam onto an annular region adjacent the periphery of said planar disc, whereby said converted molecular beam provides substantially improved step coverage and uniformity in arrival rate at said substrate of molecules from said converted molecular beam, said improved step coverage and uniformity being over the area of said substrate.

21. A molecular beam converter as in claim 4 in which said substrate is generally planar and circular in shape.

22. A molecular beam converter as in claim 21 in which said impingement surface is a flat-bottomed stubby cylinder positioned generally coaxially with said substrate, said cylinder having an inside wall of diameter greater than that of said substrate, said inside wall of said cylinder extending less than the radius of said substrate from said flat bottom toward said substrate, and said flat bottom and said substrate being generally parallel and spaced axially apart by a distance greater than the diameter of said substrate.

23. A molecular beam converter as in claim 21 in which said impingement surface is a flat-bottomed cone positioned generally coaxially with said substrate, interior conical sidewalls of said cone extending toward said substrate and terminating at a distance from said substrate greater than the radius of said substrate, extensions of said interior conical sidewalls encompassing said substrate.

24. A molecular beam converter as in claim 21 in which said impingement surface is a truncated conic section positioned generally coaxially with said substrate, spaced axially apart from said substrate by a distance greater than the diameter of said substrate, said truncated conic section having a central opening, thus enabling said molecular source to direct said incident molecular beam onto said impingement surface from an interiorly-located, coaxial position.

25. A molecular beam converter as in claim 21 in which said impingement surface is a truncated spheric section positioned generally coaxially with said substrate, spaced axially apart from said substrate by a distance greater than the diameter of said substrate, said truncated spheric section having a central opening, thus enabling said molecular source to direct said incident molecular beam onto said impingement surface from an interiorly-located, coaxial position.

26. A molecular beam converter for use in a vacuum system for coating a substrate, said molecular beam converter comprising:
  a body having an impingement surface generally facing said substrate;
  a heating means to enable said impingement surface to be maintained at a designated temperature;
  a plurality of molecular sources for forming and directing a plurality of incident molecular beams onto said impingement surface;
  impingement of said plurality of incident molecular beams on said impingement surface maintained at said designated temperature causing a plurality of converted molecular beam to flow from said surface;
  said impingement surface and said plurality of molecular sources in combination being configured to largely avoid impingement on said surface by molecular species in said plurality of converted molecular beams;
  said impingement surface and said plurality of molecular sources in combination being configured and positioned to direct said plurality of converted molecular beams generally toward said substrate.

27. A molecular beam converter as in claim 26 in which said plurality of incident molecular beams all consist of generally identical molecular species, individual ones of said incident molecular beams being directed onto generally spaced-apart areas on said impingement surface, whereby said plurality of converted molecular beams provides substantially improved step coverage and uniformity in arrival rate at said substrate of molecules from said converted molecular beams, said improved step coverage and uniformity being over the area of said substrate.

28. A molecular beam converter as in claim 26 in which individual ones of said plurality of incident molecular beams consist of differing molecular species, whereby said plurality of converted molecular beams provides a corresponding multiplicity of molecular species flowing toward said substrate.

29. A molecular beam converter as in claim 1 in which said molecular source directs said incident molecular beam onto said impingement surface in a ribbon-like area adjacent the periphery of said surface, whereby said converted molecular beam provides substantially improved step coverage and uniformity in arrival rate at said substrate of molecules from said converted molecular beam, said improved step coverage and uniformity being over the area of said substrate.

30. A molecular beam converter as in claim 7 in which said coating of said substrate is a layer of silicon grown epitaxially on said substrate.

31. A molecular beam converter for use in a vacuum system for coating a substrate, said molecular beam converter comprising:

a body having an impingement surface generally facing said substrate;

a heating means to enable said impingement surface to be maintained at a designated temperature;

a molecular source for forming and directing an incident molecular beam onto said impingement surface;

impingement of said incident molecular beam on said impingement surface maintained at said designated temperature causing a converted molecular beam to flow from said surface generally toward said substrate;

said impingement surface and said molecular source in combination being configured such that the axis of said incident molecular beam is directed against a portion of said impingement surface which is non-parallel to the axis of said incident beam.

32. A molecular beam converter as claimed in claim 31 wherein said portion of said impingement surface is non-parallel to the axis of said converted molecular beam.

* * * * *